United States Patent [19]
Brown
[11] 4,191,887
[45] Mar. 4, 1980

[54] MAGNETIC BEAM DEFLECTION SYSTEM FREE OF CHROMATIC AND GEOMETRIC ABERRATIONS OF SECOND ORDER

[75] Inventor: Karl L. Brown, Cupertino, Calif.
[73] Assignee: Varian Associates, Inc., Palo Alto, Calif.

[21] Appl. No.: 891,432
[22] Filed: Mar. 29, 1978
[51] Int. Cl.$^2$ .................... H01J 37/00
[52] U.S. Cl. .................... 250/396 ML; 250/396 R
[58] Field of Search .......... 250/396 R, 396 ML, 398, 250/399, 292, 296, 298; 335/210; 313/361, 442, 426

[56] References Cited
U.S. PATENT DOCUMENTS

| | | | |
|---|---|---|---|
| 3,344,357 | 9/1967 | Blewett | 250/396 R |
| 3,405,363 | 10/1968 | Brown | 250/396 R |
| 3,867,635 | 2/1975 | Brown et al. | 250/396 R |

*Primary Examiner*—Bruce C. Anderson
*Attorney, Agent, or Firm*—Stanley Z. Cole; Harry E. Aine; Edward H. Berkowitz

[57] ABSTRACT

In a magnetic deflection system for deflecting a beam of charged particles, through a given beam bending angle at least four beam deflecting stations are serially arranged along the beam path for bending the beam through the beam bending angle Ψ. Each of the beam bending stations includes a magnet for producing a static magnetic field component of a strength and of a shape so that the beam is deflected free of transverse geometric aberrations of second order. The beam deflection system also includes sextupole magnetic field components of such a strength and location so as to eliminate second order chromatic aberrations of the deflected beam without introducing second order geometric aberrations, whereby a magnetic beam deflection system is provided which is free of both transverse chromatic and geometric aberrations of second order.

6 Claims, 2 Drawing Figures

MAGNETIC BEAM DEFLECTION SYSTEM FREE OF CHROMATIC AND GEOMETRIC ABERRATIONS OF SECOND ORDER

BACKGROUND OF THE INVENTION

The present invention relates in general to magnetic beam deflection systems for deflecting or bending a beam of charged particles and such beam deflection system being free of chromatic and geometric aberrations of second order.

DESCRIPTION OF THE PRIOR ART

Heretofore, magnetic beam deflection systems have been proposed for bending a beam of charged particles through a given beam bending angle. Such beam deflection systems have included four or more magnetic beam bending or deflecting stations serially arranged along the beam path for bending the beam through the beam bending angle Ψ. Such magnetic beam deflection systems have been made achromatic to first order.

This type of magnetic beam deflection system is particularly useful for bending and focusing a high energy beam of non-monoenergetic charged particles, such as electrons, onto a target for producing a lobe of X-rays for use in an X-ray therapy machine. Such a prior art magnetic beam deflection system is disclosed in U.S. Pat. No. 3,867,635 issued Feb. 18, 1975 and assigned to the same assignee as the present invention. Other examples of achromatic magnetic beam deflection systems are disclosed in U.S. Pat. Nos. 3,405,363 issued Oct. 8, 1968; 3,138,706 issued June 23, 1964 and 3,691,374 issued Sept. 12, 1972.

While such prior art magnetic beam deflection systems are useful for achromatically deflecting a beam of non-monoenergetic charged particles through a given bending angle to an exit plane, they have not been free of chromatic aberrations to second order. As used herein, "chromatic aberrations" refer to aberrations of the deflected beam which are a function of variations in momentum of the charged particles being deflected.

It would be desirable to provide an achromatic beam deflection system free of chromatic and geometric aberrations of second order for use in deflecting high energy beams of non-monoenergetic charged particles as employed in X-ray therapy machines and meson therapy machines. This is particularly useful in a meson therapy machine as it is especially desirable that the geometry and chromaticity of the beam of charged particles, i.e., mesons be precisely controlled such that the meson irradiated region of the body be accurately controlled. Such machines are particularly useful for treating deep seated tumors.

It is also known from the prior art to use sextupole magnetic field components in a magnetic beam deflection system for eliminating specific chromatic aberrations in magnetic deflection systems for deflecting high energy non-monoenergetic charged particles. However, these prior magnetic deflection systems, employing the sextupole fields failed to be free of all geometric and chromatic aberrations of second order.

SUMMARY OF THE PRESENT INVENTION

The principal object of the present invention is the provision of an improved magnetic beam deflection system for deflecting beams of non-monoenergetic charged particles through a beam deflection angle such deflected beam being free of chromatic and geometric aberrations of second order.

In one feature of the present invention the beam of charged particles to be deflected is fed serially through four or more magnetic beam deflecting stations, each magnetic beam deflecting station includes first magnetic field components for bending the beam of charged particles and for focusing the beam of charged particles in each of two orthogonal directions transverse to the central orbital axis of the beam and such first magnetic field components being of a strength and location such that the deflected beam is achromatic to first order and free of geometric aberrations of the second order. Said beam deflection system further including sextupole magnetic field components of such strength and direction so as to eliminate second order chromatic aberrations of the deflected beam without introducing second order geometric aberrations.

In another feature of the present invention, each of said magnetic deflecting stations includes a pair of magnetic pole pieces disposed straddling the beam path for providing a dipole magnetic field component and each of said pole faces having beam entrance and beam exit face portions axially spaced apart along the beam path and wherein the beam entrance and beam exit face portions are curved to provide the aforementioned sextupole magnetic field components.

Other features and advantages of the present invention will become apparent upon a perusal of the following specification taken in connection with the accompanying drawings wherein;

DESCRIPTION OF THE PREFERRED EMBODIMENTS

Figure 1:
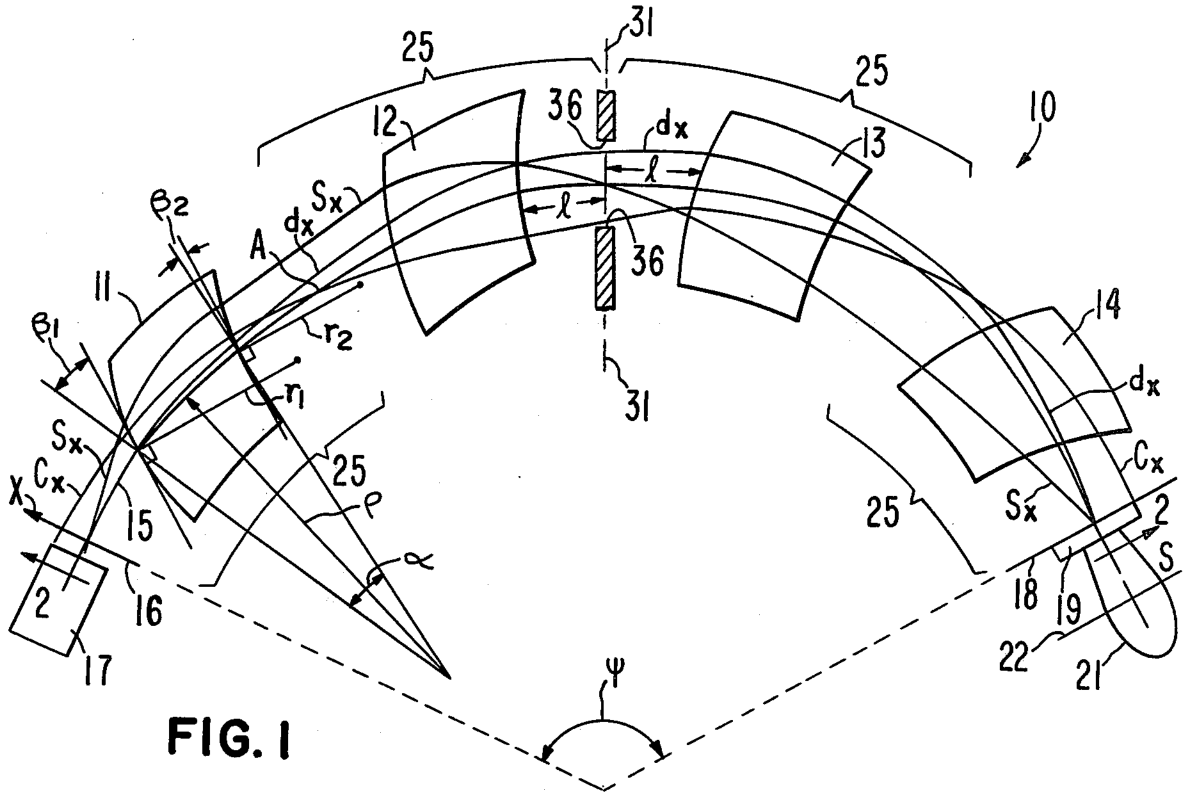
FIG. 1 is a plan view of a magnetic beam deflection system incorporating features of the present invention.

Referring now to FIG. 1, there is shown in plan view, a magnetic deflection system 10 incorporating features of the present invention. The system 10 includes four uniform field bending electromagnets 11, 12, 13, and 14 arranged along the curved trajectory defining the central orbital axis 15 of the beam deflection system 10. More particularly, the central orbital axis 15 lies in and defines the radial bending plane and is that trajectory followed by a charged particle of a reference momentum $P_o$ entering the deflection system 10 at the origin 16 and initially traveling in a predetermined direction which defines the initial trajectory of the central orbital axis 15. The charged particles of the beam are preferably initially collimated by a beam collimator 17 and projected through the beam entrance plane at the origin 16 into the magnetic deflection system 10.

In a typical example, the initial beam is formed by the output beam of a linear accelerator as collimated by collimator 17. As such, the entrance beam will have a certain predetermined spot size and will generally be non-monoenergetic, that is, there will be a substantial spread in the momentum of the beam particles about the reference momentum $P_o$ of the particle defining the central orbital axis 15.

Each of the bending magnets 11–14 bends the central orbital axis through a bending angle, $\alpha$, as of 60° and of bending radius $\rho$, each followed by or separated by rectilinear drift length portions $2l$.

A magnetic shunt structure, as of soft iron, is disposed in the spaces between adjacent bending magnets 11–14 and along the central orbital axis between the origin 16 and the first bending magnet 11 and between the last bending magnet 15 and the exit plane 18 at which a beam target 19 is placed for interception of the electron beam to generate an X-ray lobe 21 for treatment of the patient. The X-ray energy passes through an X-ray transparent portion of a vacuum envelope 22 defining an X-ray window of the X-ray therapy machine.

The magnetic shunt structure is provided with tunnel portions (see the aforecited U.S. Pat. No. 3,867,635) to accomodate passage of the beam through the shunt. The shunt serves to provide a relatively magnetic field free region in the spaces between the beam bending magnets 11, 12, 13, and 14, and in the spaces between the beam entrance and beam exit planes and the adjacent beam bending magnet structure.

Figure 2:
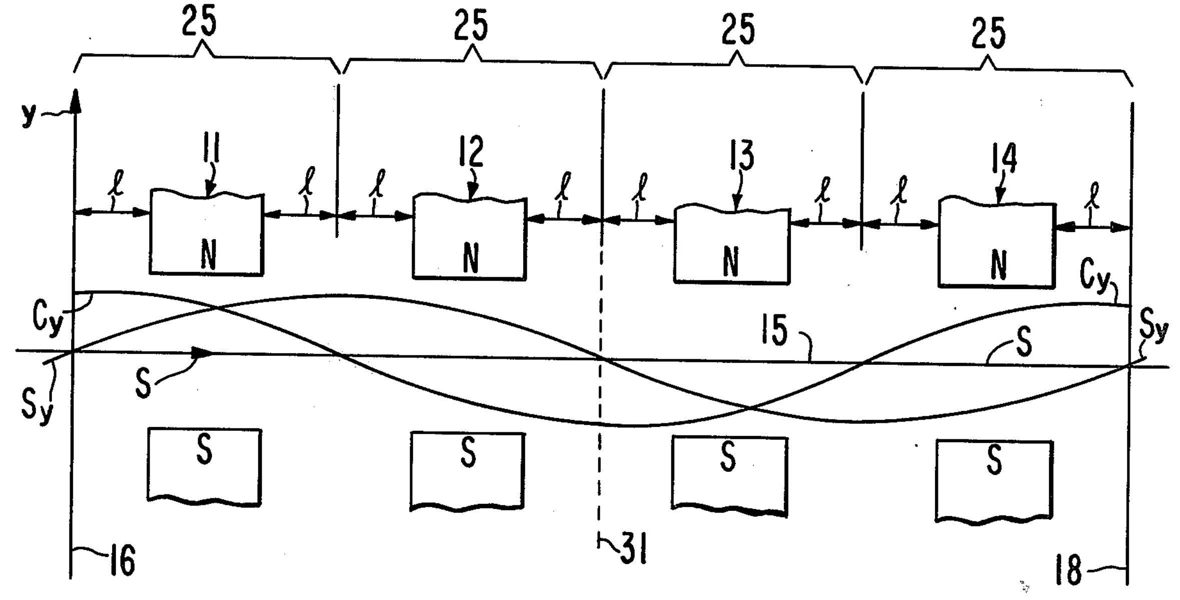
FIG. 2 is a sectional view of the structure of FIG. 1 taken along line 2—2 in the direction of the arrows showing the trajectories of certain reference particles in a plane transverse to the bending plane.

The beam bending magnetic field regions are defined by the gaps between respective pole pieces of magnets 11–14, as shown in FIG. 2, and are energized with magnetomotive force generated by an electromagnetic coil.

Each of the bending magnets 11–14 has a respective bending angle $\alpha$ and a radius of curvature $\rho$ such radius of curvature being the radius of curvature of the central orbital axis 15 within the gap of the respective bending magnet 11–14.

It has been shown that the first-order beam optical properties of any static magnetic beam deflection or transport system, posessing a magnetic median plane of symmetry such as the bending plane, is completely determined by specifying the trajectories of five characteristic particles through the system 10. This is proven in the Stanford Linear Accelerator Center (SLAC) report No. 75 of July 1967, titled "A First-and Second-Order Matrix Theory For The Design Of Beam Transport Systems And Charged Particle Spectrometers" by Karl L. Brown, and prepared under AEC Contract AT(04-3)-515. These reference trajectories are identified by their position, slope and momentum relative to a reference central orbital axis trajectory that defines the beam optical axis of the system, namely, the central orbital axis 15.

Central orbital axis 15 lies entirely within the median or bending plane. If the momentum of the particle following the central orbital axis is $P_o$, then the five characteristic trajectories are defined as follows:

$s_x$ is the path (trajectory) followed by a particle of momentum $P_o$ lying in the median bending plane on the central orbital axis with unity slope, where "unity slope" is defined in the aforecited SLAC report 75;

$c_x$ is the trajectory followed by a particle of momentum $P_o$ lying in the median bending plane and having an initial displacement in the bending plane normal to the central orbital axis of unity with an initial slope relative to the orbital axis 15 of zero, i.e., parallel to the orbital axis;

$d_x$ is the trajectory of a particle initially coincident with the central orbital axis but posessing a momentum of $P_o+\Delta P$;

$s_y$ is the trajectory followed by a particle of momentum $P_o$ initially on the central orbital axis and having unity slope relative thereto in the transverse plane normal to the bending plane; and $c_y$ is the trajectory followed by a particle of momentum $P_o$ having an initial displacement of unity in the transverse direction from the central orbital axis and being initially parallel to the central orbital axis.

It can be shown that, because of median plane (bending plane) symmetry of the deflection system 10, the aforedescribed bending or radial plane trajectories are decoupled from the transverse or y plane trajectories, i.e., trajectories $s_x$, $c_x$ and $d_x$ are independent of trajectories $s_y$ and $c_y$. The aforedescribed five characteristic trajectories for the magnetic deflection system 10 are shown in FIGS. 1 and 2, respectively.

Referring now to FIG. 1 and considering the initially divergent $s_x$ trajectory, it is desired in the magnetic deflection system 10 that the output beam, i.e., the deflected emergent beam at the output plane 18, as focused onto the target 19, have the identically same properties as the collimated input beam at the beam entrance plane at the origin 16.

It has been proven in SLAC report 91, titled "TRANSPORT/360 A Computer Program For Designing Charged Particle Beam Transport Systems" prepared for the U.S. Atomic Energy Commission under Contract No. AT(04-3)-515, dated July 1970, at page A-45 that for any place in the deflection system 10 wherein the two different types of trajectories, namely, the cos like trajectories ($c_x$, $c_y$) and sin like trajectories ($s_x$, $s_y$) are paired for a given plane and related such that one type of trajectory is experiencing a crossover of the orbital axis where the other type of trajectory is parallel to the orbital axis, there will be a waist in the beam for that particular plane, namely bending plane (x-plane for the paired $s_x$ and $c_x$ terms) or transverse plane (y-plane for the paired $s_y$ and $c_y$ term).

In the magnetic deflection system 10, it is desired to have a beam waist in the bending plane of the beam at the mid-plane 31. Accordingly the sin-like trajectory $s_x$ is deflected to a crossover of the orbital axis 15 at the mid-plane 31, whereas the cos-like trajectory $c_x$ is focused through a crossover at A and back into parallelism with the orbital axis 15 at the midplane 31. This allows a radial waist (waist in the bending plane) at the mid-plane 31.

The momentum dispersive trajectory $d_x$ (See FIG. 1) is near or at its maximum displacement from the orbital axis at the mid-plane 31. This assures maximum momentum analysis since at the mid-plane 31 the momentum dispersive particles, i.e., particles with $\Delta P$ from $P_o$, will have a near maximum radial displacement from the central orbital axis 15 and such displacement will be proportional to $\Delta P$ for the particular particle. This combined with the radial waist for the non-momentum dispersive $s_x$ and $c_x$ particles allows the placement of a momentum defining slit 36 at the midplane 31 to achieve momentum analysis of the beam for shaving off the tails of the momentum distribution of the beam. This also places the momentum analyzer 36 at a region remote from the target 19 such that X-rays emanating from the analyzer are easily shielded from the X-ray treatment zone.

Referring now to FIG. 2 there is shown the desired trajectories $s_y$ and $c_y$ in the transverse plane (s-y plane) which is transverse to the bending (s-x) plane. As above stated, a waist in the transverse plane occurs where one of the trajectories $s_y$ and $c_y$ is parallel to the orbital axis 15. A minimum magnetic gap width for the beam deflection mangets 11, 12, 13 and 14 will be achieved if a beam waist in the transverse plane occurs at the midplane 31. Accordingly, the cos term ($c_y$) is focused to parallelism with the orbital axis at the midplane 31 while the sin term ($s_y$) is focused to a crossover of the orbital axis 15 at the midplane 31.

The various parameters of the beam bending magnet system 10 are chosen to achieve the aforedescribed trajectories $s_x$, $c_x$, $d_x$, $s_y$ and $c_y$ as illustrated in FIGS. 1 and 2. More particularly, the conditions and parameters for the magnet system 10 that must be fulfilled can be established by reference solely to certain first-order monoenergetic trajectories traversing the system 10.

First order beam optics may be expressed by the matrix equation:

$$\vec{X}(1)=R\vec{X}(0) \qquad \text{Eq. (1)}$$

relating the positions and angles of an arbitrary trajectory relative to a reference trajectory at any point in question, such as an arbitrary point designated position (1), as a function of the initial positions and angles of the trajectory at the origin (0) of the system, i.e., at orgin 16, herein designated (0). The proposition of Equation (1) is known from the prior art, such as the aforecited SLAC Report No. 75 or from an article by S. Penner titled "Calculations of Properties of Magnetic Deflection Systems" appearing in the Review of Scientific Instruments, Volume 32, No. 2 of February 1961, see pages 150–160.

Thus, at any specified position in the system 10, an arbitrary charged particle is represented by a vector, i.e., a single column matrix, $\vec{X}$ whose components are the positions, angles, and momentum of the particle with respect ot a specified reference trajectory, for example the central orbital axis 15. Thus, $$\vec{X}=\begin{bmatrix} x \\ \theta \\ y \\ \Phi \\ l \\ \delta \end{bmatrix} \qquad \text{Eq. (2)}$$

where:

- $x$ = the radial displacement of the arbitrary trajectory with respect to the assumed central orbital trajectory 15;
- $\theta$ = the angle this arbitrary trajectory makes in the bending plane with respect to the assumed central orbital trajectory 15;
- $\Phi$ = the angular divergence of the arbitrary trajectory in the transverse plane with respect to the assumed central trajectory 15;
- $y$ = the transverse displacement of the arbitrary trajectory in a direction normal to the bending plane with respect to the assumed central orbital trajectory 15;
- $l$ = the path length difference between the arbitrary trajectory and the central orbital trajectory 15; and
- $\delta = \Delta P/P_o$ and is the fractional momentum deviation of the particle of the arbitrary trajectory from the assumed central orbital trajectory 15.

In Equation (1), R is the matrix for the beam deflection system between the initial (0) and final position (1), i.e., between positions of the origin (0) and the point in question, position (1). More particularly, the basic matrices for the various beam deflecting components such as drift distance $l$, angle of rotation $\beta$ of the input or output faces of the individual bending magnets 11–14, and the bending angle $\alpha$ are as follows:

$$R_l=\begin{bmatrix} 1&1&0&0&0&0 \\ 0&1&0&0&0&0 \\ 0&0&1&1&0&0 \\ 0&0&0&1&0&0 \\ 0&0&0&0&1&0 \\ 0&0&0&0&0&1 \end{bmatrix} \qquad \text{Eq. (3)}$$

$$R\beta=\begin{bmatrix} 1&0&0&0&0&0 \\ \frac{\tan\beta}{\rho}&1&0&0&0&0 \\ 0&0&1&0&0&0 \\ 0&0&\frac{\tan(\beta-\psi)}{\rho}&1&0&0 \\ 0&0&0&0&1&0 \\ 0&0&0&0&0&1 \end{bmatrix} \qquad \text{Eq. (4)}$$

$\psi$ = Correction term resulting from finite extent of fringing fields. Note: It is not the total angle of bend as used elsewhere herein.

$$R\alpha=\begin{bmatrix} \cos\alpha & \rho\sin\alpha & 0&0&0& \rho(1-\cos\alpha) \\ \frac{-\sin\alpha}{\rho} & \cos\alpha & 0&0&0& \sin\alpha \\ 0&0&1&\rho\alpha&0&0 \\ 0&0&0&1&0&0 \\ \sin\alpha & \rho(1-\cos\alpha) & 0&0&1& \rho(\alpha-\sin\alpha) \\ 0&0&0&0&0&1 \end{bmatrix} \qquad \text{Eq. (5)}$$

Thus, the matrix R for the first bending magnet is given by $R_{BEND}=(R\,\beta_2)\,(R\,\alpha_1)\,(R\,\beta_1)$ where $\beta_1$ is the angle of rotation of the plane of the input face relative to the radius of the central orbital axis at their point of intersection, and $\beta_2$ is the similarly defined angle of rotation of the output face of the first bending magnet relative to the central orbital axis 15, as shown in FIG. 1 and as defined by the abovecited Penner article at FIG. 2 of page 153 and the abovecited SLAC report 91 at FIG. 748A15 of page 2-4. The matrix for one cell 25 (Bending Station) is given by

$$R_c=R_lR_{bend}\,R_l$$

The transfer matrix to the midplane 31 is then:

$$R_m=R_cR_c$$

and the total transfer matrix to the end of the system is:

$$R_T=R_cR_cR_cR_c=R_mR_m$$

The matrix R to the mid-plane 31 is also as follows:

$$R_M=\begin{bmatrix} R(11)&R(12)&0&0&0&R(16) \\ R(21)&R(22)&0&0&0&R(26) \\ 0&0&R(33)&R(34)&0&0 \\ 0&0&R(43)&R(44)&0&0 \\ R(51)&R(52)&0&0&1&R(56) \\ 0&0&0&0&0&1 \end{bmatrix} \qquad \text{Eq. (7)}$$

where the elements of the matrix comprise R(ij) where i refers to the row and j to the column position in the matrix. Because of the symmetry on opposite sides of the bending plane, the matrix R is decoupled in the x (bending plane) and y (transverse) planes.

The matrix elements are related to the aforedescribed trajectories as follows:

$R(12)=s_x$; $R(11)=c_x$; $R(16)=d_x$ $R(34)=s_y$; and $R(33)=c_y$.

Referring now to the matrix $R_M$ Eq.(7) above, and to the aforedescribed preferred trajectories, at the mid-point of the system, namely, at the midplane 31 where intercepted by the central orbital axis 15, R(16) (the spatial dispersion) $d_x$ is a near maximum in this design. At this same point R(12)=R(21)=0, namely $s_x$ is a crossover and the first derivative of $c_x$ is zero namely parallel to the orbital axis 15. This corresponds to a waist of the source, i.e., the collimator, thus permitting momentum analysis of the beam at the mid-plane 31.

The preferred magnetic deflection system 10 is further characterized by trajectory R(34)=R(43)=0 at the mid-plane 31. Thus at the mid-point, $s_y$ is focused to a crossover of the orbital axis 15 while the first derivative of $c_y^1$ is zero, i.e., $c_y^1$=R(43)=0, i.e., $c_y$ is parallel to the orbital axis at the mid-plane 31. This assures a mid-plane waist in the transverse beam envelope, such waist being independent of the initial phase space area of the beam. The symmetry of the system assures that both R(34) and R(43) terms are identically zero at the target location 19. This is equivalent to stating that both the sine-like term and the derivative of the cosine-like term are zero. These conditions are precisely the conditions required for coincidence of point-to-point focusing and for a waist, as has been shown in the SLAC Report No. 91 aforecited.

At the end of the system, i.e., at the target 19, R(12)=R(34)=0 meaning that point-to-point imaging occurs in both the radial and the transverse planes and that the final beam spot size is stable relative to the input defining collimator 17. Furthermore, R(11)=R(33)=1 assuring unity magnification of the initial beam spot size.

The matrix $R_M$ at the mid-plane 31 may now be written as:

$$R_M = \begin{bmatrix} -1 & 0 & 0 & 0 & 0 & R(16) \\ 0 & -1 & 0 & 0 & 0 & R(26) \\ 0 & 0 & -1 & 0 & 0 & 0 \\ 0 & 0 & 0 & -1 & 0 & 0 \\ R(51) & R(52) & 0 & 0 & 1 & R(56) \\ 0 & 0 & 0 & 0 & 0 & 1 \end{bmatrix} \qquad \text{Eq. (8)}$$

Thus, the total matrix $R_T$ at the target is of the form $$R_T = R_M R_M = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ R(51) & R(52) & 0 & 0 & 1 & R(56) \\ 0 & 0 & 0 & 0 & 0 & 1 \end{bmatrix} \qquad \text{Eq. (9)}$$

Thus, both the dispersion R(16) and its derivative R(26) are zero at the output. This is the necessary and sufficient condition that the system be achromatic to first-order.

Thus, from the above discussion it has been shown that in the preferred magnetic deflection system 10, several of the matrix elements should have the values (−1) or (0) at the mid-plane 31.

In other words, R(11)=R(22)=R(33)=R(44)=−1 and

R(12)=R(21)=R(34)=R(43)=0 at the mid-plane 31. This above statement comprises a set of simultaneous matrix equations and at least five unknowns, namely, $\alpha$, $\rho$, $l$, $\beta_1$ and $\beta_2$.

The aforecited simultaneous matrix equations can be solved by hand. However, this is a very tedious process and a more acceptable alternative is to solve the simultaneous equations by means of a general purpose computer programmed for that purpose. A suitable program is one designated by the name TRANSPORT. A copy of the program, run onto one's own magnetic tape is available upon request and the appropriate backup documentation is available to the public by sending requests to the Program Librarian, at SLAC, P.O. Box 4349, Stanford, Calif. 94305. The aforecited SLAC Report No. 91 is a manual describing how to prepare data for the TRANSPORT computation, and this manual is available to the public from the Reports Distribution Office at SLAC, P.O. Box 4349, Stanford, Calif. 94305.

In designing the magnetic deflection system 10 of the present invention, the fringing effects of the various bending magnets should be taken into account. More particularly, the effective input and output faces of the bending magnet do not occur at the boundary of the region of uniform field but extend outwardly of the uniform field region by a finite amount. See aforecited U.S. Pat. No. 3,867,635.

The above discussion pertains to the first-order magnetic deflection and focusing properties of system 10. To discuss second-order magnetic deflection and focusing properties, it is convenient to express the first-and second-order magnetic deflection and focusing properties by the following matrix equation (Eq. 10) as used in SLAC Reports #75 and #91. The coordinates of an arbitrary ray relative to the central orbital axis 15 is given by, $$X_i = \sum_j R_{ij}X_j + \sum_{j,k} T_{ijk}X_jX_k \qquad \text{Eq. (10)}$$

where $X_1=x$, $X_2=\theta$, $X_3=y$, $X_4=\Phi$, $X_5=l$, $X_6=\delta$.

The first order part of the equation $$X_i = \sum_j R_{ij}X_j \qquad \text{Eq. (11)}$$

is another way of writing the first-order matrix equation, Eq. (1), and the $X_i$ are the components of the vector $\vec{X}$ in Eq. (2).

The $T_{ijk}$ coefficient represent the second order terms of the magnetic optics. Terms involving only the subscripts 1,2,3, and 4 represent the transverse second-order geometric aberrations and terms involving the subscripts 6 plus 1,2,3,4, represent the second-order transverse chromatic aberrations.

We consider only stystems which have a magnetic mid-plane common to all of the dipole, quadrupole and sextupole components comprising the system. In the system 10, this is the s-x plane containing the orbital axis 15 and the x corrdinate (bending plane). For such systems, only the following second-order terms may be non-zero:

There are 20 such geomteric aberration terms:

$T_{111}$, $T_{112}$, $T_{122}$, $T_{133}$, $T_{144}$, $T_{211}$, $T_{212}$, $T_{222}$, $T_{233}$, $T_{244}$, $T_{134}$, and $T_{234}$, $T_{313}$, $T_{314}$, $T_{323}$, $T_{324}$, $T_{413}$, $T_{414}$, $T_{423}$, $T_{424}$, and 10 such chromatic aberration terms:

$T_{116}$, $T_{126}$, $T_{166}$, $T_{216}$, $T_{226}$, $T_{266}$, $T_{336}$, $T_{346}$, $T_{436}$, $T_{446}$

It has been discovered that if the number of identical unit cells (bending station 25) is equal to or greater than 4 and if $R_{ij}=1$ for $i=j$ and $R_{ij}=0$ for $i\neq j$ where $i,j=1,2,3,4$, i.e. R is the unity matrix, then all of the above second-order geometric aberrations essentially vanish.

It has been further discovered that if two sextupole components are introduced into each unit cell in the manner prescribed below, then all of the above second-order chromatic terms, will also essentially vanish. A sextupole component is here defined to be any modification of the magnetic mid-plane field that introduces a second derivative of the transverse field with respect to the transverse coordinate x. In the particular example given in FIG. 1, the sextupole component has been introduced by the cylindrical curvatures ($1/r_1$) and ($1/r_2$) on the input and output faces of each bending magnet. The axis of revolution of $r_1$ and $r_2$ fall on the perpendicular to the assumed flat input and output faces of the magnet, coincident with the orbital axis 15. Other ways of introducing sextupole components include any second order curvature to the entrance or exit faces of the bending magnet or a second-order variation in the field expansion of the mid-plane field or by introducing separate sextupole magnets before or after the bending magnets.

The two sextupole field components are spaced apart along the orbital axis 15 in unit cell 25 so that one component couples predominately to the x direction chromatic terms $T_{116}$, $T_{126}$, $T_{166}$, $T_{216}$, $T_{226}$, and $T_{266}$ and the other sextupole component couples predominately to the y direction terms $T_{336}$, $T_{346}$, $T_{436}$, $T_{446}$. The strength of coupling is proportional to the magnitude of the dispersion function $R(16)=dx$ and to the size of the monoenergetic beam envelope in the respective coordinate x or y at the chosen location of the sextupole components.

The adjustment procedure employed to derive the magnitude of the sextupole field is to select any one of the x-chromatic terms and any one of the y-chromatic terms that have a relatively large value with the sextupole components turned off. Call these terms $T_x$ and $T_y$. Then let the strength of the sextupole components be $M_x$ and $M_y$ where $M_x$ and $M_y$ are proportional to the second derivative of the field that they introduce. The next step is to determine the derivatives of $T_x$ and $T_y$ with respect to $M_x$ and $M_y$. Call these partial derivatives $\partial T_x/\partial M_x$, $\partial T_x/\partial M_y$, $\partial T_y/\partial M_x$, $\partial T_y/\partial M_y$.

Now assume that the initial values of the aberrations are $T_x$ and $T_y$ before the sextupole components are turned on, then the values of $M_x$ and $M_y$ required to make the chromatic aberrations essentially vanish are given by the solution of the following two simultaneous linear equations:

$$M_x\frac{\partial T_x}{\partial M_x} + M_y\frac{\partial T_x}{\partial M_y} + T_x = 0 \qquad \text{Eq. (12)}$$

$$M_x\frac{\partial T_y}{\partial M_x} + M_y\frac{\partial T_y}{\partial M_y} + T_y = 0 \qquad \text{Eq. (13)}$$

In practice it is more convenient to use a second-order fitting program such as TRANSPORT to solve these equations and find the required values of $M_x$ and $M_y$. The remarkable discovery is that all of the second-order chromatic aberrations essentially vanish with just two sextupole components $M_x$ and $M_y$, found from Eqs. (12) and (13), present in each unit cell 25.

As thus far described, all the bending stations 25 bend the beam in the same direction, i.e. have the same magnetic polarity. However, this is not a requirement, any arrangement of sequential bending station polarities is permissable that satisfies the following relations:

$$n\geq 4,\ N\neq 1 \text{ or } 3$$

where n is the total number of bending stations 25 and N is the number of identical repetiive bending station polarity sequence patterns, such as ↑ ↓ | ↑ ↓, in which case N=2, n=4, or such as ↑ ↑ ↑ ↑ in which case n=N=4.

In a typical example of a beam deflection system 10, as shown in FIGS. 1 and 2, $P_o=40.511$ MeV, $\alpha=60°$, $\rho=15.8$ cm, $l=21.2$ cm, $\beta_1=31°$, $\beta_2=0$, $\Psi=240°$, $r_1=45.9$ cm, and $r_2=-38.6$ cm, where a positive radius is convex and a minus radius is concave.

What is claimed is:

1. In a method for deflecting a beam of non-monoenergetic charged particles through a given bending angle in a beam deflecting system, the steps of:

directing the beam of charged particles serially through four or more magnetic beam deflecting stations:

producing first magnetic field components in each of said magnetic beam deflecting stations for bending the beam of charged particles and for focusing the beam of charged particles in each of two orthogonal directions transverse to the central orbital axis of the beam, said first magnetic field components being of a strength and so directed that the beam, as deflected through the beam deflecting system, is achromatic to first order and free of transverse geometric aberrations of second order; and subjecting the beam of charged particles to sextupole magnetic field components within each station of the beam deflecting system of such strength and direction so as to eliminate second order transverse chromatic aberrations of the deflected beam without introducing second order transverse geometric aberrations.

2. The method of claim 1 wherein the first magnetic field components includes a dipole magnetic field component for bending the central oribtal axis of the beam, and quadrupole magnetic field components for focusing the beam in the two orthogonal transverse directions, and wherein each of said beam deflecting stations includes a pair of said sextupole magnetic field components axially spaced apart along the beam for eliminating said aforementioned chromatic aberrations of second order.

3. The method of claim 2 wherein each of said magnetic beam deflecting stations includes a pair of magnetic pole pieces disposed straddling the beam path for providing the beam bending dipole magnetic field component, and wherein each of said pole pieces has a beam entrance and beam exit face portion axially spaced apart along the beam path, and wherein said beam entrance and beam exit face portions are shaped to provide said sextupole magnetic field components.

4. In a beam deflecting system for deflecting a beam of non-monoenergetic charged particles through a given beam bending angle:

beam deflecting means having four or more magnetic beam deflecting stations serially arranged along the beam path of the beam of charged particles for bending the beam through the given beam bending angle;

each of said magnetic beam deflecting stations including magnet means for producing first magnetic field components in each of said beam deflecting stations for bending the beam of charged particles and for focusing the beam of charged particles in each of two orthogonal directions transverse to the central orbital axis of the beam, said first magnetic field component being of a strength and direction relative to the beam path so that the beam, as deflected through the beam deflecting system, is achromatic to first-order and free of transverse geometric aberrations of second-order; and sextupole magnet means disposed within each station of said magnetic beam deflection system for producing sextupole magnetic field components within the beam path of such a strength and direction so as to eliminate second-order chromatic aberrations of the deflected beam without introducing second-order geometric transverse aberrations.

5. The apparatus of claim 4 wherein each of said magnet means of each of said magnetic beam deflecting stations includes means for producing a dipole magnetic field component for bending the central orbital of the beam, and a quadrupole magnetic field component for focusing the beam in the two orthogonal transverse directions, and wherein each of said beam deflecting stations includes said sextupole magnet means for producing a pair of said sextupole magnetic field components axially spaced apart along the beam path for eliminating said aforementioned chromatic aberrations of second order.

6. The apparatus of claim 5 wherein each of said magnetic beam deflection stations includes a pair of magnetic pole pieces disposed straddling the beam path for providing the beam bending dipole magnetic field component, each of said pole pieces having a beam entrance and beam exit face portion axially spaced apart along the beam path, and wherein said beam entrance and beam exit face portions are shaped to provide said sextupole magnetic field components.

* * * * *